United States Patent
Beckedahl et al.

(10) Patent No.: US 8,283,784 B2
(45) Date of Patent: Oct. 9, 2012

(54) METHOD FOR PRODUCING A POWER SEMICONDUCTOR MODULE, AND POWER SEMICONDUCTOR MODULE COMPRISING A CONNECTION DEVICE

(75) Inventors: Peter Beckedahl, Oberasbach (DE); Markus Knebel, Tuchenbach (DE); Thomas Stockmeier, Erlangen (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 77 days.

(21) Appl. No.: 12/797,331

(22) Filed: Jun. 9, 2010

(65) Prior Publication Data
US 2011/0001244 A1    Jan. 6, 2011

(30) Foreign Application Priority Data
Jun. 9, 2009 (DE) .......................... 10 2009 024 385

(51) Int. Cl.
*H01L 23/52* (2006.01)
*H01L 21/768* (2006.01)
(52) U.S. Cl. ......... 257/773; 257/E23.141; 257/E21.575; 257/774; 257/700; 257/701; 438/618
(58) Field of Classification Search .................. 257/773, 257/E23.141, 774, 700, 701, E21.575; 438/618
See application file for complete search history.

(56) References Cited

U.S. PATENT DOCUMENTS
7,042,074 B2   5/2006  Goebl
7,227,259 B2 *  6/2007 Heilbronner et al. ......... 257/724
7,626,256 B2  12/2009 Göbl et al.
2007/0085201 A1 *  4/2007 Bauer et al. .................... 257/728
2010/0090328 A1 *  4/2010 Goebl et al. .................... 257/687
2010/0258935 A1 * 10/2010 Knebel et al. .................. 257/691

FOREIGN PATENT DOCUMENTS
DE     10 2006 027 482      8/2007
DE      102006027482        8/2007
EP       1 455 391 A1  *    9/2004
EP         1548829           6/2005
EP       1 755 163 A1  *    2/2007
EP         2061071           5/2009

* cited by examiner

*Primary Examiner* — A O Williams
(74) *Attorney, Agent, or Firm* — The Law Offices of Roger S. Thompson

(57) ABSTRACT

A method for making a power semiconductor module and a module produced by that method, wherein the module includes a substrate, a connection device and load terminal elements, wherein power semiconductor components are arranged on a conductor track of the substrate and connected to one of the load terminal element by the connection device. The power semiconductor module has auxiliary contact pads which can be connected to an external printed circuit board. The primary production step in this case is cohesively connecting respective first contact areas of the first conductor tracks to at least one second contact area of a power semiconductor component and at least one third contact area of a load terminal element; afterwards, the assemblage composed of at least one power semiconductor component of a connection device and load terminal elements is arranged to form a housing of the power semiconductor module.

9 Claims, 3 Drawing Sheets

METHOD FOR PRODUCING A POWER SEMICONDUCTOR MODULE, AND POWER SEMICONDUCTOR MODULE COMPRISING A CONNECTION DEVICE

BACKGROUND OF THE INVENTION

1. Field of the Invention

The invention is directed to a method for producing a power semiconductor module, and a power semiconductor module produced by the method and comprising a connection device, which is embodied as a film assemblage composed of at least two electrically conductive layers with an insulating layer respectively arranged therebetween.

2. Description of the Related Art

German Patent Application No. DE 10 2006 027 482 A1 discloses, in principle, a power semiconductor module comprising: a substrate; semiconductor components arranged thereon in a circuit-conforming manner; and a connection device. The latter consists of a film assemblage composed of two electrically conductive layers with an insulating layer arranged therebetween, wherein at least one conductive layer, that of the load terminals, is intrinsically structured and thus forms conductor tracks. The conductive layer forms a load current-carrying contact device for reversible connection to an external lead in the edge region. For this purpose, the contact device has either a spring element with an abutment in the housing or a locking screw acting directly on the contact device.

What is disadvantageous about these configurations, however, is that these embodiments of the external connection are limited in terms of their current-carrying capacity. Furthermore, these configurations with a locking screw permit only a limited mechanical stability in the embodiment of the connection.

SUMMARY OF THE INVENTION

It is an object of the present invention to provide a method for producing a power semiconductor module and an associated power semiconductor module made in accordance with the inventive method. Such a module includes a connection device, which module is amenable to a standardized manufacturing process, has mechanically stable load terminal elements and meets requirements with regard to air clearances and creepage distances in accordance with IEC 61287.

The inventive method starts with a substrate which can be arranged on a cooling device and is electrically insulated therefrom. The substrate has, on its side facing the interior of the power semiconductor module, a plurality of conductor tracks and power semiconductor components arranged on the conductor tracks. The power semiconductor components are connected to one another, or to a conductor track of the substrate, in a circuit-conforming manner by means of a connection device.

The connection device in turn is formed from a layer sequence comprising a first electrically conductive structured metal film, an electrically insulating film and a second electrically conductive structured metal film. In this case, the respective structurings form first and second conductor tracks from the respective metal films, which, for their part, form the circuit-conforming connections mentioned above.

Furthermore, the power semiconductor module according to the invention has a plurality of load terminal elements for the external connection of the customary load potentials of a power semiconductor module. The power semiconductor module likewise has auxiliary terminal elements for the external connection of, for example, control and/or sensor potentials. These external connections are formed by means of auxiliary contact pads of the second conductor tracks of the connection device.

The method according to the invention for producing a power semiconductor module of this type is characterized by the following steps:

providing the substrate and the connection device; the connection device is advantageously embodied in such a way that the insulating film of the connection device projects beyond all the first conductor tracks in the direction from the substrate towards the edge of the film in such a way that with respect to second conductor tracks of the second film which extend as far as or close to the edge, there is sufficient distance to allow sufficient air clearances and creepage distances for electrical safety;

simultaneously or sequentially, cohesively connecting respective first contact areas of the first conductor tracks to at least one second contact area of a power semiconductor component and at least one third contact area of a load terminal element; this can preferably be effected by means of a pressure sintering process which forms all the abovementioned connections in one process step; it may also be advantageous to form the load terminal elements as planar straight shaped metal bodies each having a predetermined bending location.

arranging the assemblage composed of at least one power semiconductor component of a connection device and load terminal elements to form the housing of the power semiconductor module. In this case, it is advantageous if a respective section of the connection device on which the contact areas with the load terminal elements are arranged, during the arrangement to form the housing, becomes situated perpendicularly to the plane defined by the substrate. For this purpose, the connection device is angled into a bending region before this arrangement.

It is furthermore advantageous if, after the arrangement to form the housing, the insulating film with at least one second conductor track projects beyond the housing. It is likewise advantageous if the load terminal element is angled at the predetermined bending location before being arranged jointly with the connection device to form the housing of the power semiconductor module. The contact area of the load terminal element for connection to the connection device thus becomes situated on the outer side of the first limb. It is furthermore advantageous if the second limb of the load terminal element has a cut-out for a screw feedthrough and said second limb is arranged parallel to the substrate.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be explained in greater detail on the basis of exemplary embodiments in conjunction with FIGS. 1 to 5.

DETAILED DESCRIPTION OF THE PRESENTLY PREFERRED EMBODIMENTS

Figure 1:
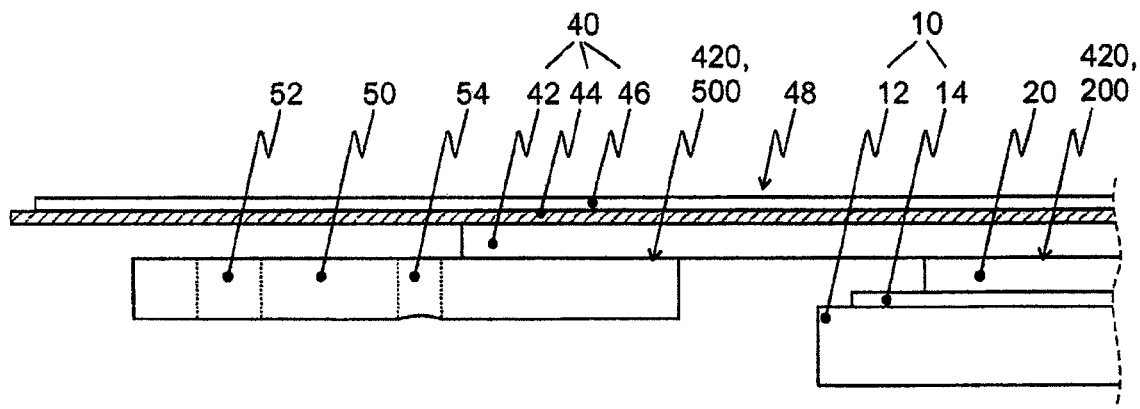
FIG. 1 shows a step of the inventive method for producing a power semiconductor module.

FIG. 1 shows a step of the method according to the invention for producing a power semiconductor module. The illustration shows a substrate 10 comprising an insulating material body 12 and first conductor tracks 14 arranged thereon, and also a load terminal element 50. Load terminal element 50 is embodied here as a planar shaped metal body having a predetermined bending location 54 for subsequently forming an angular configuration of load terminal element 50.

A power semiconductor component 20 and the still-planar load terminal element 50 are electrically conductively connected to one another by means of a connection device 40. Connection device 40 has a layer sequence of a first electrically conductive structured metal film 42, an electrically insulating film 44 and a second electrically conductive structured metal film 46. In this case, the respective structurings form first and second conductor tracks from the respective metal films. The electrically conductive connections of respective third contact areas 200 of power semiconductor component 20 and second contact areas 500 of the load terminal element 50 to assigned first contact areas 420 of first conductor track 42 of the connection device 40 are formed by means of a pressure sintering connection. The illustration likewise shows a bending region 48 (also cf. FIG. 2) at which connection device 40 is angled before arrangement with a housing 30 (FIG. 2).

According to the invention, insulating film 44 of connection device 40 projects beyond all first conductor tracks 42 in the direction from substrate 10 towards the edge of insulating film 44 in such a way that, from first 42 to second 46 conductor tracks which extend as far as or close to this edge, there is sufficient distance to provide sufficient air clearances and creepage distances for electrical safety.

Figure 2:
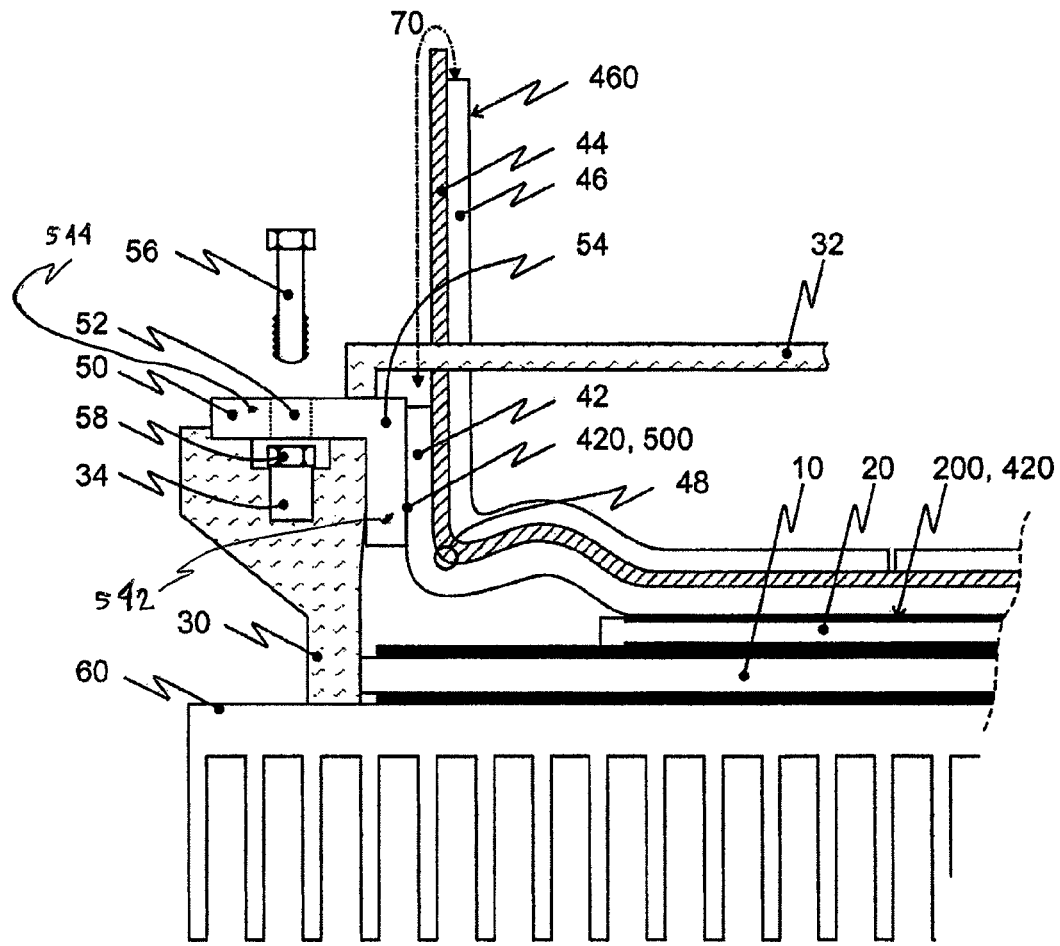
FIG. 2 shows a first embodiment of the inventive power semiconductor module.

FIG. 2 shows a fundamental configuration of the inventive power semiconductor module, this power semiconductor module being produced according to the inventive method. The illustration shows an insulating substrate 10 such as is known in various configurations in principle from the application in power semiconductor modules. Substrate 10 has a plurality of connection tracks (14, cf. FIG. 1) on its surface facing the interior of the power semiconductor module. Power semiconductor components 20 are arranged on connection tracks 14 and are preferably cohesively connected to the connection tracks by means of solder or sintering connections.

The connection device (40, cf. FIG. 1) serves for the further formation of the circuit-conforming internal connections of the power semiconductor components 20, connection device 40 including, for its part, a layer sequence comprising a first electrically conductive structured metal film 42, an electrically insulating film 44 and a second electrically conductive structured film 46. If necessary, this layer sequence can be continued in an alternating fashion. The respective structurings of the first 42 and second 46 metal films form first and second conductor tracks that are in each case electrically insulated from one another.

Conductor tracks 42, 46 not only serve for internal circuit-conforming connection within power semiconductor module 20 but also form parts of the external terminal elements. For this purpose, connection device 40 has at least one region which is not arranged parallel to the substrate surface. This region is preferably situated perpendicularly to the plane defined by the substrate surface and has, on first conductor tracks 42, first contact areas 420 for connection to second contact areas 500 of load terminal elements 50, only one of which is illustrated.

Load terminal element 50 comprise an angular shaped metal part, a first limb 542 of which, with its outer side forming the contact area 500, is arranged on first contact area 420 of first conductor track 42 of connection device 40 and a second limb 544 of which has a cut-out 52 for a screw feedthrough 56. Second limb 544 is arranged parallel to substrate 10. First conductor track 42 assigned to load terminal element 50 extends as far as the plane formed by that surface of second limb 544 of the load terminal element 50 which faces away from the substrate 10, small tolerances being harmless here as long as the necessary air clearances and creepage distances 70 are complied with.

Insulating film 44 of connection device 40 and also the second conductor tracks 46 project beyond the plane, wherein second conductor tracks 46 here do not carry a load potential, but rather control and/or sensor potentials. This extension beyond the plane is embodied in such a way that the necessary air clearances and creepage distances 70 for ensuring the electrical safety of the power semiconductor module between load potential and control potential are formed by the insulating film.

Housing 30 of the power semiconductor module is likewise illustrated schematically, wherein it completely encloses substrate 10 and the load terminal elements 50 in such a way that an external contact-connection by means of a screw connection 56, 58 is possible. According to the invention, insulating film 44 and the second conductor tracks 46 project beyond a portion 32 for housing 30 to form external auxiliary terminal elements 460 there.

Figure 3:
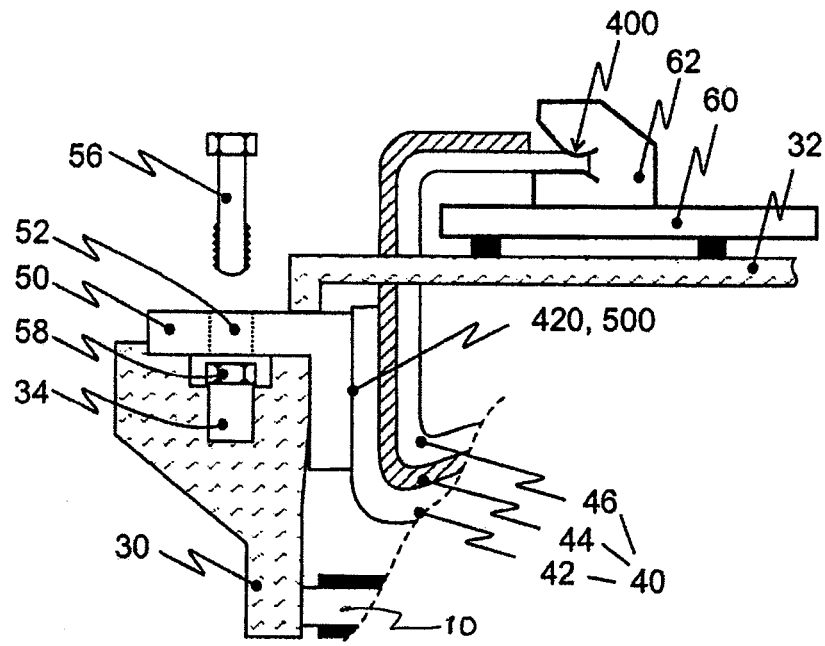
FIG. 3 shows a second embodiment of the inventive power semiconductor module.

FIG. 3 shows a second embodiment of the inventive power semiconductor module. The power semiconductor module is once again formed from the two primary components, housing 30 and substrate 10 with power semiconductor components 20 (not shown in FIG. 3), connection device 40 and load terminal elements 50. For this purpose, in a first step of production, the second component is formed for example by means of the method step discussed above in relation to FIG. 1. Generally, this is preferably effected by means of solder and/or pressure sintering connections. In this case, connection device 40 is connected to power semiconductor components 20 in a first step, and the connection between power semiconductor components 20 and substrate 10 and simultaneously the connection between load terminal elements 50 and connection device 40 are formed in a next step. Alternatively, any desired sequential embodiment of all the individual connections is possible, including by means of different technologies.

Before the arrangement of the second component, load terminal element 50 is additionally brought to the angular shape along the predetermined bending location 54 (cf. FIG. 1) and then this component is joined together with housing 30. According to the invention, a part of connection device 40, namely a part of insulating film 44 and of second conductor tracks 46, projects from housing 30. There the end of connection device 40 forms auxiliary contact pads 400 for a single- or multi-pole plug contact which can be arranged in a plug connector 62 of an external printed circuit board 60. The flexibility of connection device 40 forms automatically a tensile force interruption, as a result of which a secure plug connection is ensured. A meandering course of connection device 40 outside housing 30 could additionally be provided. Plug connector 62 for the connection of the control and/or sensor signals is advantageously arranged on the external printed circuit board with driver circuits, which, for its part, can be arranged in a manner spaced apart from housing 30 of the power semiconductor module and parallel to substrate 10 thereof.

Figure 4:
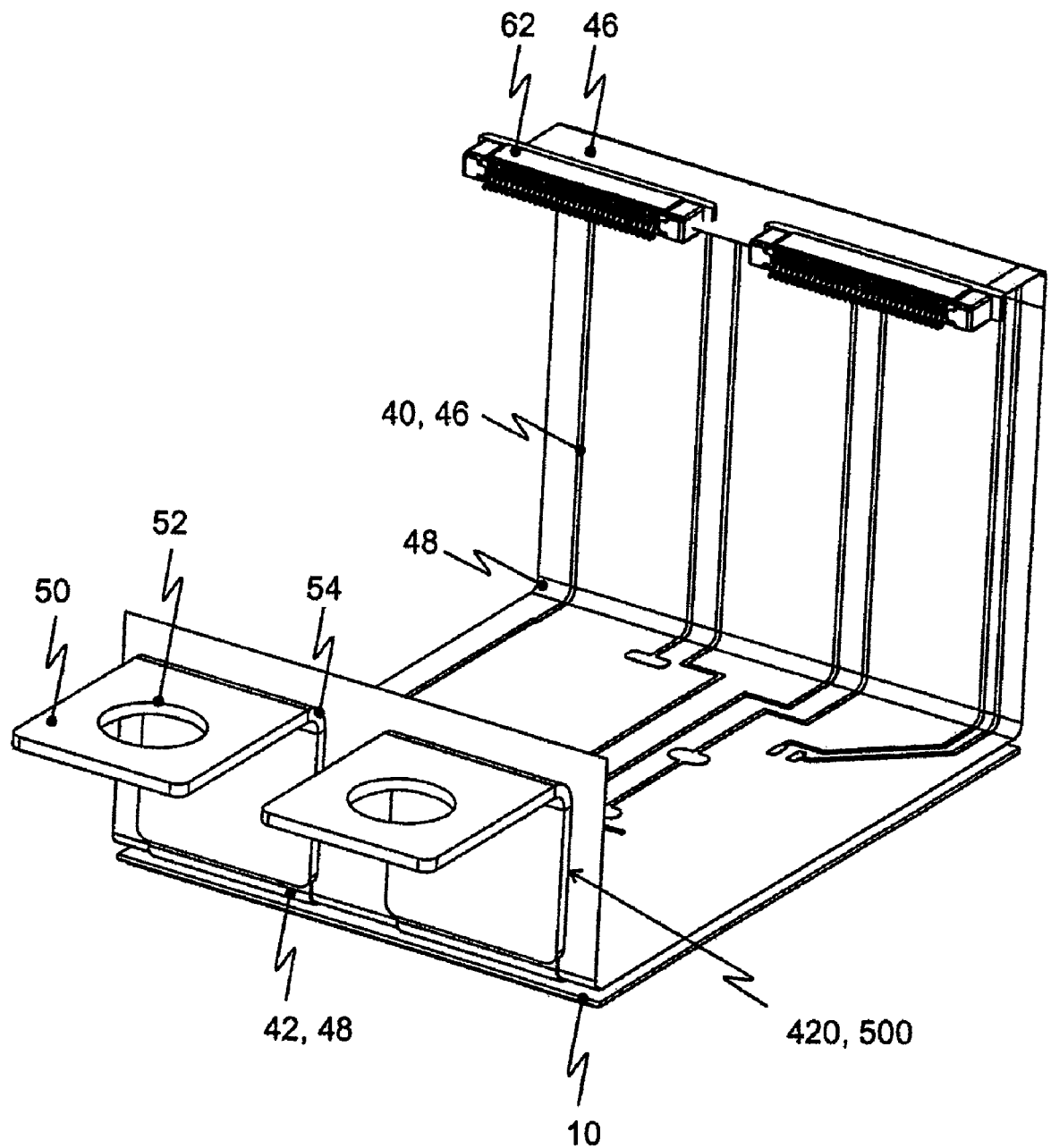
FIG. 4 shows a perspective view of the second embodiment of the inventive power semiconductor module.

FIG. 4 shows a perspective view of the second power semiconductor module according to the invention. The course of first and second conductor tracks 42, 46 described with regard to FIG. 3 can once again clearly be seen in this case.

Figure 5:
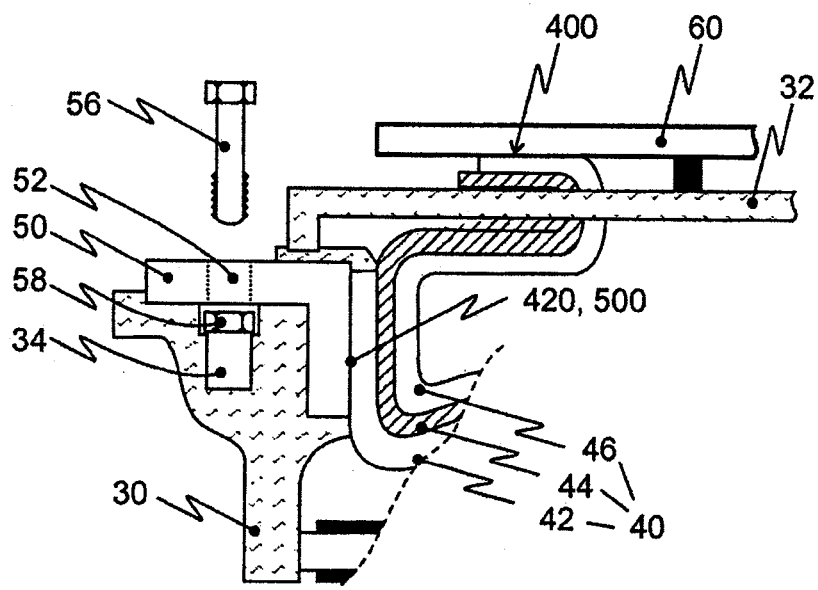
FIG. 5 shows a variation of the second embodiment of the inventive power semiconductor module.

FIG. 5 shows a variation of the second embodiment of the inventive power semiconductor module. It differs to the effect that the auxiliary contact pads 400 of the second conductor tracks 46, as a result of 180° offset of the connection device 40, become situated on the side—facing away from the housing 30—of that section of the connection device 40 which projects from said housing. As a result of this, an electrical connection to an external printed circuit board 60 arranged thereabove is possible in a simple manner by pressure 64 being exerted on the connection to the second conductor tracks 46 via the printed circuit board 60. For this purpose, portion 32 of housing 30 forms an abutment for this introduction of pressure.

In addition, housing 30 is not formed here until during the production of the power semiconductor module by means of at least load terminal element 50 being enclosed by means of an injection method. A prefabricated housing can thus be dispensed with.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve substantially the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for producing a power semiconductor module used for housing at least one power semiconductor, the power semiconductor including connectors for connecting to at least one load terminal element, the method comprising the steps of:
providing a substrate;
disposing a connection device which includes a layer sequence having a first electrically conductive structured metal film, an electrically insulating film and a second electrically conductive structured metal film, atop said substrate, said connection device also including auxiliary contact pads which are configured to connect to an external circuit;
forming respective first and second conductor tracks from the respective metal films;
cohesively connecting respective first contact areas of said first conductor tracks to at least one second contact area of the power semiconductor and at least one third contact area of the load terminal element thereby forming an assemblage of the at least one power semiconductor and said connection device and the load terminal elements; and
arranging said assemblage to form a housing of the power semiconductor module.

2. The method of claim 1,
wherein said substrate defines a plane; and
the method further comprises the steps of:
angling said connection device in a bending region; and
forming a section of said connection device on which contact areas for contacting the load terminal elements are arranged, so that it is situated perpendicularly to the plane defined by said substrate.

3. The method of claim 2, further comprising the step of:
forming said insulating film so that it projects beyond all said first conductor tracks in the direction from said substrate towards the edge of said insulating film to a least a distance that, with respect to said second conductor tracks of the second film which extend as far as or close to said edge, there is sufficient distance to accommodate air clearances and creepage distances for electrical safety; and
wherein, after the arrangement to form said housing, said insulating film with at least one second conductor track projects beyond said housing.

4. The method of claim 1, further comprising the step of:
forming said insulating film so that it projects beyond all said first conductor tracks in the direction from said substrate towards the edge of said insulating film to a least a distance that, with respect to said second conductor tracks of the second film which extend as far as or close to said edge, there is sufficient distance to accommodate air clearances and creepage distances for electrical safety; and
wherein, after the arrangement to form said housing, said insulating film with at least one second conductor track projects beyond said housing.

5. The method of claim 1, further comprising the step of:
forming at least one load terminal element as an angular shaped metal part having first and second limbs, a contact area of which for connection to said connection device is arranged on an outer side of said first limb and said second limb of which has a cut-out for a screw feedthrough, said second limb being arranged parallel to said substrate and the angular shape is formed prior to the arrangement of said connection device in said housing.

6. A power semiconductor module comprising:
a substrate;
a connection device having a layer sequence of at least a first electrically conductive and structured metal film, an electrically insulating film and a second electrically conductive and structured film;
a plurality of load terminal elements for connecting to said power semiconductor component by said connection device, and
a housing for housing at least portions of said substrate, said connection device and said load terminal elements;
wherein the respective structurings of said first and second electrically conductive films form respective first and second conductor tracks configured to receive at least one power semiconductor component; and wherein at least one first conductor track has a contact area which is cohesively connected to at least one of said load terminal elements, and wherein said connection device has auxiliary contact pads configured to be connected to an external printed circuit board.

7. The power semiconductor module of claim 6, wherein said connection device includes a portion having contact areas for connecting to said load terminal elements, and said portion is situated perpendicularly to a plane defined by said substrate.

8. The power semiconductor module of claim 7, wherein said insulating film projects beyond all of said first conductor tracks in the direction away from said substrate towards the edge of said insulating film so that, with respect to said second conductor tracks which extend as far as said edge, there is sufficient distance to accommodate air clearances and creepage distances for electrical safety, and wherein this part of said insulating film with at least one second conductor track projects beyond said housing.

9. The power semiconductor module of claim 6, wherein at least one load terminal element is embodied as an angular shaped metal part having first and second limbs, and a contact area for connection to said connection device, said contact area being arranged on an outer side of said first limb, said second limb having a cut-out for a screw feedthrough and being arranged parallel to said substrate.

* * * * *